(12) United States Patent
Kobayashi

(10) Patent No.: US 6,812,128 B2
(45) Date of Patent: Nov. 2, 2004

(54) METHOD OF MANUFACTURING MULTILAYER STRUCTURED SEMICONDUCTOR DEVICE

(75) Inventor: Motoki Kobayashi, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/364,341

(22) Filed: Feb. 12, 2003

(65) Prior Publication Data

US 2004/0067636 A1 Apr. 8, 2004

(30) Foreign Application Priority Data

Oct. 3, 2002 (JP) ........................................ 2002-291031

(51) Int. Cl.⁷ ............................................. H01L 21/4763
(52) U.S. Cl. ....................... 438/622; 438/623; 438/624; 438/626; 438/631; 438/637; 438/639; 438/666; 438/780; 438/782; 438/787; 438/790; 438/906; 438/948; 438/963
(58) Field of Search ................................ 438/622–626, 438/631–633, 637–640, 723, 738, 743, 780–782, 787, 789–790, 906, 666, 948, 963

(56) References Cited

U.S. PATENT DOCUMENTS

| | | | |
|---|---|---|---|
| 5,286,674 A | | 2/1994 | Roth et al. |
| 5,321,211 A | | 6/1994 | Haslam et al. |
| 5,646,440 A | | 7/1997 | Hasegawa |
| 5,668,052 A | * | 9/1997 | Matsumoto et al. ......... 438/624 |
| 5,877,081 A | * | 3/1999 | Matsumoto et al. ......... 438/624 |
| 5,935,868 A | * | 8/1999 | Fang et al. .................. 438/692 |
| 6,136,687 A | * | 10/2000 | Lee et al. .................... 438/624 |
| 6,153,512 A | * | 11/2000 | Chang et al. ................ 438/624 |
| 6,177,343 B1 | * | 1/2001 | Watanabe et al. ........... 438/639 |
| 6,200,735 B1 | | 3/2001 | Ikegami |
| 6,271,119 B1 | | 8/2001 | Kishimoto |
| 6,326,318 B1 | * | 12/2001 | Watanabe et al. ........... 438/780 |
| 6,350,672 B1 | | 2/2002 | Sun |
| 6,358,835 B1 | | 3/2002 | Kanamura |
| 6,437,441 B1 | * | 8/2002 | Yamamoto .................. 438/622 |
| 6,500,745 B1 | | 12/2002 | Ikegami |
| 6,514,855 B1 | | 2/2003 | Shioya et al. |
| 2001/0048162 A1 | | 12/2001 | Haruhana et al. |
| 2001/0054765 A1 | | 12/2001 | Ohto et al. |

FOREIGN PATENT DOCUMENTS

| | | |
|---|---|---|
| JP | 6-45452 | 2/1994 |
| JP | 6-45457 | 2/1994 |
| JP | 07-273190 | 10/1995 |
| JP | 8-162528 | 6/1996 |
| JP | 09-007971 | 1/1997 |
| JP | 10-303294 | 11/1998 |
| JP | 11-195762 | 7/1999 |
| JP | 11-260815 | 9/1999 |
| JP | 11-297829 | 10/1999 |
| JP | 11-354499 | 12/1999 |
| JP | 2000-164699 | 6/2000 |
| JP | 2000-232159 | 8/2000 |
| JP | 2000-357734 | 12/2000 |
| JP | 2001-118925 | 4/2001 |
| JP | 2001-223267 | 8/2001 |
| JP | 2001-351918 | 12/2001 |
| JP | 2002-9150 | 1/2002 |
| JP | 2002-237603 | 8/2002 |

\* cited by examiner

*Primary Examiner*—Lynne A. Gurley
(74) *Attorney, Agent, or Firm*—Volentine Francos & Whitt, PLLC

(57) ABSTRACT

A step for forming a wiring on a semiconductor substrate, a step for forming a first silicon oxide film on the semiconductor substrate having the wiring, and a step for forming an interlayer insulating film composed of a material bearing a low specific inductive capacity on the first silicon oxide film are sequentially executed to form a multilayered wiring. The interlayer insulating film is formed to have a smaller thickness relative to a step of the first silicon oxide film, so as not to extend beyond the step of the first silicon oxide film.

16 Claims, 6 Drawing Sheets

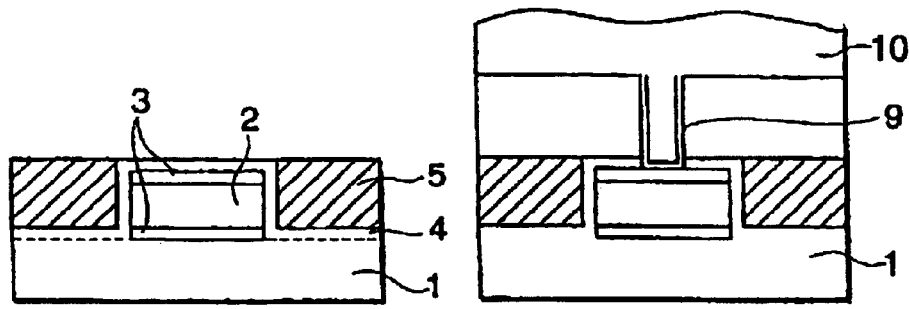
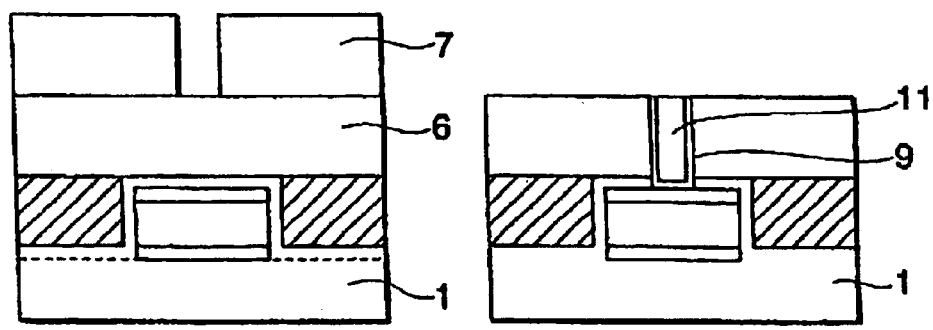
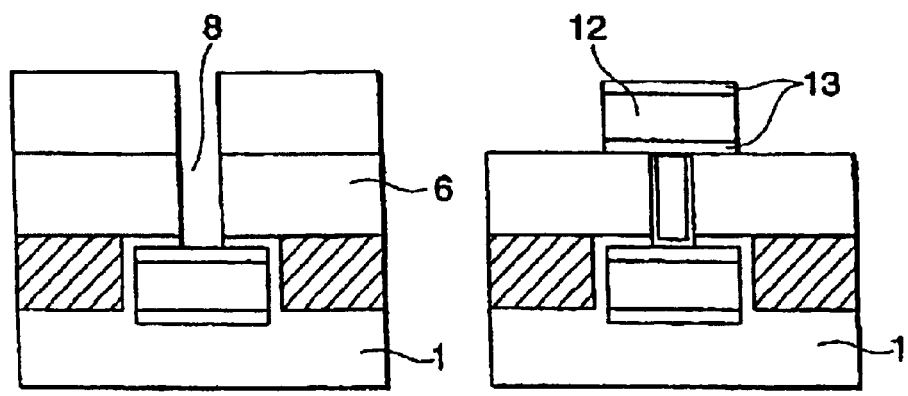

METHOD OF MANUFACTURING MULTILAYER STRUCTURED SEMICONDUCTOR DEVICE

BACKGROUND OF THE INVENTION

1. Field of the Invention

This invention relates to a method of manufacturing a semiconductor device having a multilayer structure, and particularly to a method using a material bearing a low specific inductive capacity as an interlayer insulating film.

2. Description of the Related Art

A silicon oxide film has heretofore been used as an interlayer insulating film of a semiconductor device having a multilayer structure. In recent years, however, a start has been made at using materials lower in specific inductive capacity than the silicon oxide film in order to reduce a signal transfer delay of a wiring with high integration of circuit elements.

Of such types of materials, HSQ (Hydrogen silisesquioxane) and MSQ (Methyl silisesquioxane) each assuming a specific inductive capacity of about 3.0 have led to a stage intended for practical use.

The HSQ is a silicon oxide compound containing Si—H bonds. Further, the MSQ is a silicon oxide compound containing Si—$CH_3$ bonds. These materials are applied onto a semiconductor substrate and thereafter heated and baked, whereby they can be brought to interlayer insulating films.

However, the following problems have arisen upon actually manufacturing a multilayer structured semiconductor device by using these materials.

Namely, these materials easily deteriorate or change in quality due to being exposed to plasma or a solution of a chemical agent. This is because SiH and Si—$CH_3$ are easily transformed to Si—O due to the plasma or the solution of chemical agent.

Accordingly, these materials change in quality in an etching step, a resist ashing step, a cleaning step, etc. normally executed upon the manufacture of the semiconductor device. Thus, there were cases in which their dielectric constants increased and the materials were eroded (encroachment).

Particularly when the MSQ was used, it eroded rapidly due to a $WF_6$ gas and hence a large-scale cavity was apt to occur. Further, a tungsten film has partly grown within the cavity to thereby short-circuit between wirings.

SUMMARY OF THE INVENTION

The present invention adopts the following configurations to solve the foregoing problems.

There is provided a method of manufacturing a multilayer structured semiconductor device, wherein when a step for forming a wiring on a semiconductor substrate, a step for forming a first silicon oxide film on the semiconductor substrate having the wiring, and a step for forming an interlayer insulting film composed of a material bearing a low specific inductive capacity on the first silicon oxide film are sequentially executed to form a multilayered wiring, the interlayer insulating film is formed to a thin thickness corresponding to a step of the first silicon oxide film so as not to extend beyond the step of the first silicon oxide film covering the wiring formed on the semiconductor substrate.

In the above-described method, the interlayer insulating film composed of the material bearing the low specific inductive capacity is formed to a thin thickness corresponding to the step of the wiring formed on the semiconductor substrate so as not to extend beyond the step when the first silicon oxide film is omitted.

After the above steps, a step for forming a second silicon oxide film on the interlayer insulating film, a step for planarizing the second silicon oxide film, a step for patterning a resist for forming a hole communicating with the wiring by lithography, a step for etching the second silicon oxide film and the first silicon oxide film with the resist as a mask, a step for removing the resist by ashing after the completion of the etching, and a step for cleaning the wired semiconductor substrate with the remaining ashed resist by chemicals are continuously executed to complete a multilayer structured semiconductor device There is provided a method of manufacturing a multilayer structured semiconductor device, wherein in the case where a step for forming a wiring on a semiconductor substrate, a step for forming a first silicon oxide film on the semiconductor substrate having the wiring, and a step for forming an interlayer insulting film composed of a material bearing a low specific inductive capacity on the first silicon oxide film are sequentially executed to form a multilayered wiring, even when the position of a hole communicating with the wiring formed on the semiconductor substrate is displaced, the first silicon oxide film is formed to a thick thickness corresponding to the displacement so that the hole makes no contact with the material bearing the low specific inductive capacity.

After the above steps, a step for forming a second silicon oxide film on the interlayer insulating film, a step for planarizing the second silicon oxide film, a step for patterning a resist for forming a hole communicating with the wiring by lithography, a step for etching the second silicon oxide film and the first silicon oxide film with the resist as a mask, a step for removing the resist by ashing after the completion of the etching, and a step for cleaning the wired semiconductor substrate with the remaining ashed resist by chemicals are continuously executed to complete a multilayer structured semiconductor device.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 1 is a diagram for describing a typical example of a manufacturing process employed in a method of manufacturing an interlayer structure, according to a first embodiment of the present invention;

DETAILED DESCRIPTION OF THE INVENTION

Figure 2:
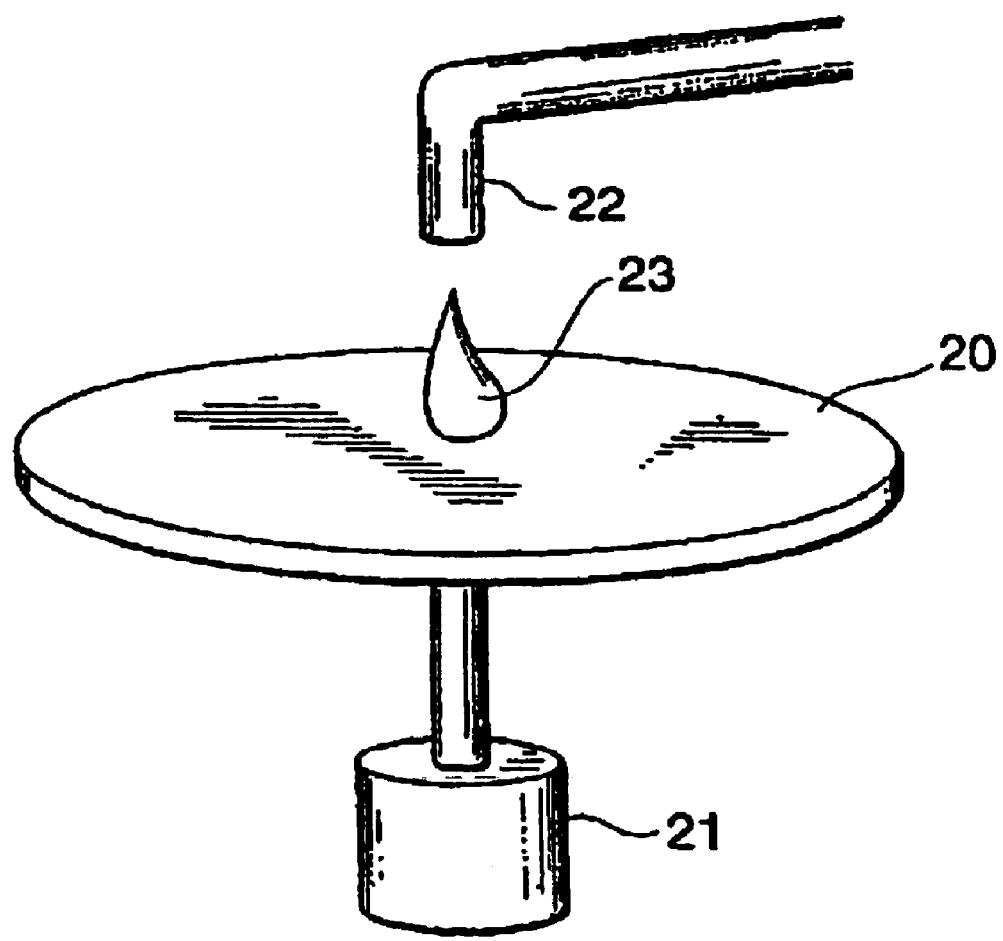
FIG. 2 is a diagram for describing the principle of a spin coat method.

Preferred embodiments of the present invention will hereinafter be described using specific examples.

First Embodiment

FIG. 1 is a diagram for describing a typical example of a manufacturing process employed in a method of manufacturing an interlayer structure, according to a first embodiment of the present invention.

In the present embodiment, MSQ corresponding to a low specific inductive capacity material is used as a material for an interlayer insulating film.

A process step shown in FIG. 1A shows a state in which the application or coating of an MSQ film 5 has been ended or a state in which post-application baking has already been finished. Up to this state, an underlying layer 1 composed of silicon oxide is formed on an unillustrated semiconductor substrate and thereafter an aluminum wiring 2 is formed. Patterning using the normal lithography forms the aluminum wiring 2. Subsequently, a thin first silicon oxide film 4 having a thickness of about 100 nm is formed and thereafter the MSQ film 5 is formed 400 nm by a spin coat method.

The spin coat method is a method wherein as its principle is shown in FIG. 2, a liquefying material 23 is dropped through a nozzle 22 whose open end is positioned above a central portion of a wafer 20 while the wafer 20 is being rotated by a spindle 21, and the liquefying material 23 is isotropically and uniformly expanded toward the peripheral edge portion of the wafer 20 under the action of centrifugal force to thereby perform its application or coating. When the spin coat method is used, the MSQ film 5 is brought to a relatively flat state without depending on the shape of an underlying base.

The present invention is characterized in that as shown in FIG. 1A, the thickness of the MSQ film 5 is formed thinner than a step of the first silicon oxide film 4 covering the wiring 2 at all parts of the substrate upon formation of the MSQ film 5 by the spin coat method. On the other hand, the thickness of the wiring varies for each product using it. Further, the thickness of the first silicon oxide film 4 corresponding to a liner film also varies for each product in a manner similar to the above. However, if each pattern formed while the thickness thereof is being changed, is confirmed upon formation of the MSQ film 5 by the spin coat method, then the thickness of the MSQ film 5 can be easily determined.

Next, as shown in FIG. 1B, a second silicon oxide film 6 is formed about 400 nm by CVD. When it is necessary to enhance flatness, the second silicon oxide film 6 is formed to a thickness of 800 nm or more and thereafter the surface thereof is polished by a CMP method. Afterwards, a resist 7 patterned by the normal lithography is formed on the second silicon oxide film 6. A process step shown in the drawing shows a state in which it has been completed.

Next, as shown in FIG. 1C, the second silicon oxide film 6 is dry-etched to form a hole 8. The result of its formation corresponds to a process step shown in the drawing. This etching is effected on the normal silicon oxide film and executed by means of plasma etching in a $C_4F_8/O_2/Ar$ gas system.

Next, as shown in FIG. 1D, the resist 7 is removed by ashing, and the interior of the hole 8 defined in the second silicon oxide film 6 and its flat portion are cleaned, after which a tungsten layer 10 is formed by CVD.

Further, as shown in FIG. 1E, the tungsten layer 10 is etched to form a tungsten plug 11.

Subsequently, an upper wiring 12 is formed as shown in FIG. 1F.

According to the above-described process, a two-layer wiring structure is formed.

By repeating the above-described process, three-layer or four-layer wiring structure is formed.

Figure 3A:
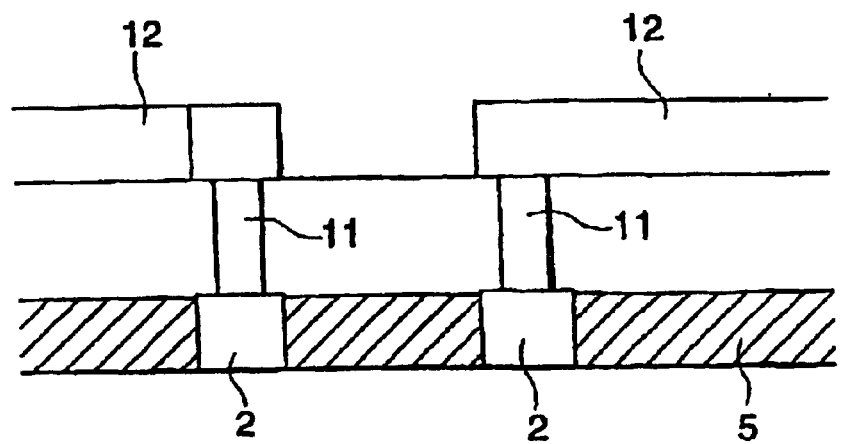
FIG. 3 is a diagram for describing the whole structure of a completed wiring employed in a semiconductor device.
Figure 3B:
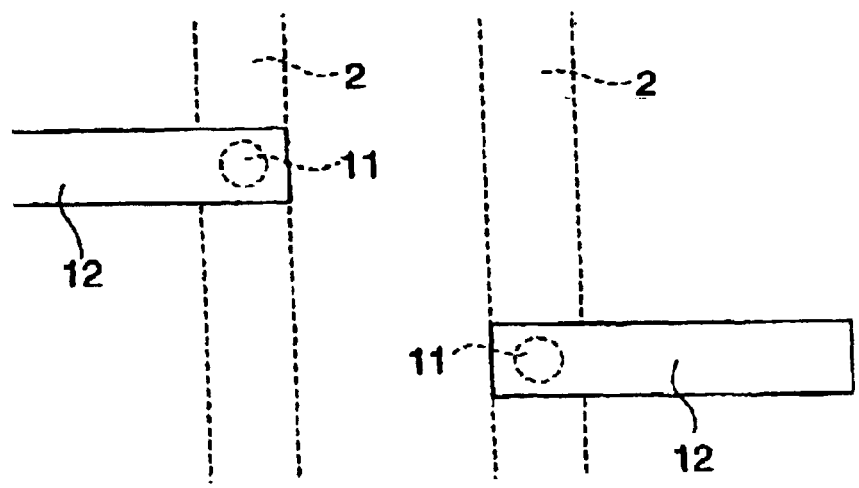

The whole structure of completed wirings is formed as shown in FIG. 3 by way of example. As shown in FIG. 3A, lower wirings 2 and upper wirings 12 are respectively connected to one another by tungsten plugs 11. An MSQ film 5 is interposed between the wirings 2 adjacent to each other and interposed even between the wiring 2 and the wiring 12, whereby the MSQ film 5 serves as an interlayer insulating film. Thus, a dielectric constant between the wiring 2 and the wiring 12 is lowered so that a field intensity developed between these wirings is reduced, thus resulting in satisfactory signal transfer. FIG. 3B is a diagram of the structure shown in FIG. 3A as viewed from thereabove. In the illustrated example, the wirings 2 and the wirings 12 are respectively orthogonal to one another. The MSQ film 5 functions to the fullest extent as the interlayer insulating film formed between the wiring 2 and the wiring 12.

Figure 4A:
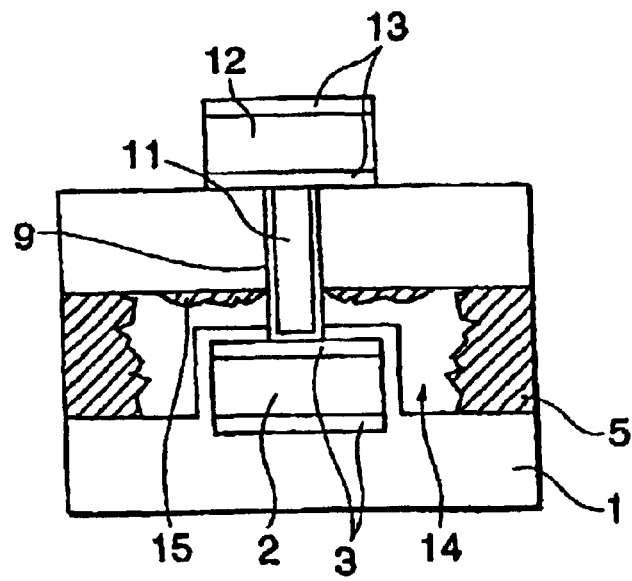
FIG. 4 is a diagram for describing improvements made by the interlayer structure manufacturing method according to the first embodiment of the present invention.
Figure 4B:
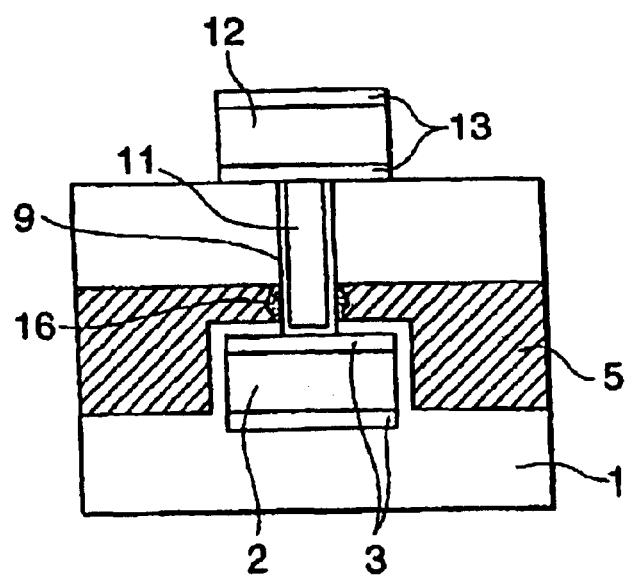

The operation of the first embodiment 1 of the present invention will now be described with reference to FIG. 4. FIG. 4 shows a case in which no changes occur according to the present invention. FIG. 4A depicts a case in which a corroded portion 15 has occurred in a low specific inductive capacity material. FIG. 4B illustrates a case in which a deteriorated portion 16 has occurred in a low specific inductive capacity material. These are produced as a result of formation of the MSQ film 5 beyond the step of the first silicon oxide film 4. According to the present invention, the MSQ film 5 is not etched upon the etching processing for forming the tungsten plug 11 as a result of formation of the MSQ film 5 in an area comparted by the step of the first silicon oxide film 4 and the second silicon oxide film 6. Accordingly, such states as shown in FIG. 4 do not occur.

According to the first embodiment as described above, the film of the low specific inductive capacity material is formed thin as compared with the step of the wiring. It is therefore possible to prevent the low specific inductive capacity material from deteriorating due to a $WF_6$ gas to thereby increase a dielectric constant and corroding to thereby cause a defective or chipped portion upon the process step of forming the tungsten plug. Further, it is possible to prevent the occurrence of a large-scale cavity and development of a short circuit between wirings due to the entrance of tungsten therein.

Second Embodiment

FIG. 5 is a diagram for describing a typical example of a manufacturing process employed in a method of manufacturing an interlayer structure, according to a second embodiment of the present invention.

In the present embodiment, MSQ corresponding to a low specific inductive capacity material is used as a material for an interlayer insulating film.

Figure 5A:
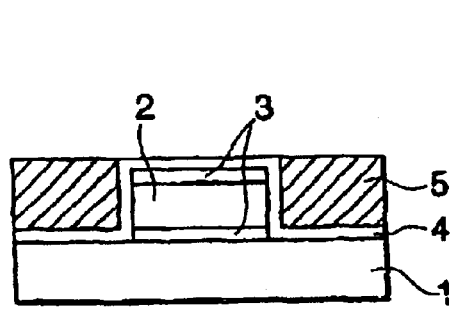
FIG. 5 is a diagram for describing a typical example of a manufacturing process employed in a method of manufacturing an interlayer structure, according to a second embodiment of the present invention.

A process step shown in FIG. 5A shows a state in which the application or coating of an MSQ film 5 has been ended or a state in which post-application baking has already been finished. Up to this state, an underlying layer 1 composed of silicon oxide is formed on an unillustrated semiconductor substrate and thereafter an aluminum wiring 2 is formed. Patterning using the normal lithography forms the aluminum wiring 2. Subsequently, a thin first silicon oxide film 4 having a thickness of about 100 nm is formed and thereafter the MSQ film 5 is formed 400 nm by a spin coat method.

Figure 5D:
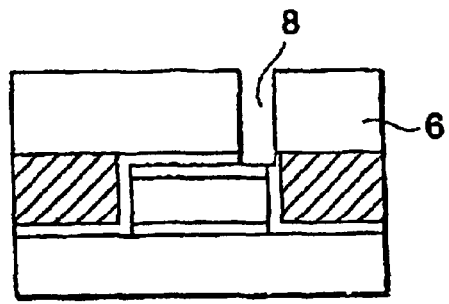
Figure 5B:
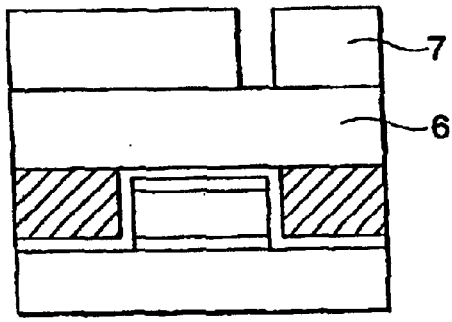

Next, as shown in FIG. 5B, a second silicon oxide film 6 is formed about 400 nm by CVD. When it is necessary to enhance flatness, the second silicon oxide film 6 is formed to a thickness of 800 nm or more and thereafter the surface thereof is polished by a CMP method. Afterwards, a resist 7 patterned by the normal lithography is formed on the second silicon oxide film 6. A process step shown in the drawing shows a state in which it has been completed.

Figure 6:
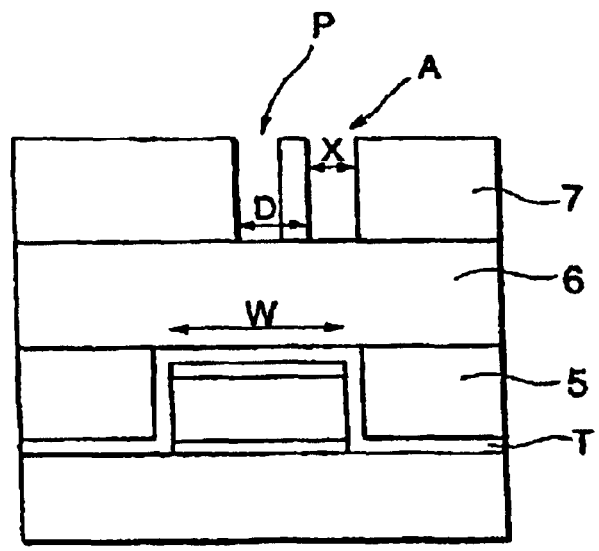
FIG. 6 is a diagram for describing the principle of the interlayer structure manufacturing method according to the second embodiment of the present invention.

A second feature of the present invention is shown in FIG. 6. FIG. 6 shows a process step identical to FIG. 5B. It is inevitable that even in the current lithography technology, a displacement occurs between an original design contact position P and an actual contact position A. This is called an "alignment displacement". The alignment displacement is expressed in D in FIG. 6.

As micro-fabrication and high integration of a device progresses and a wiring width W becomes narrow, the alignment displacement D causes the following problems.

Figure 7A:
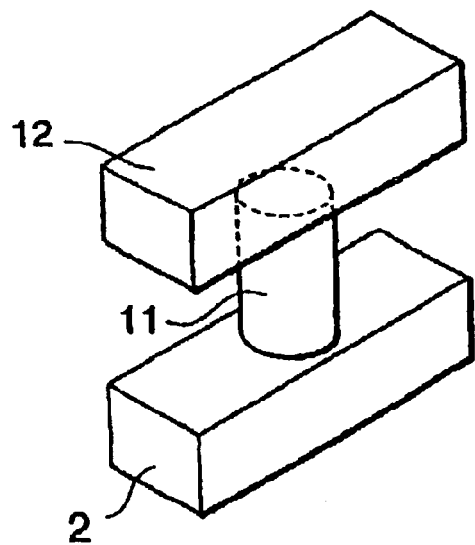
FIG. 7 is a diagram for describing a wiring structure handled in the second embodiment of the present invention.
Figure 7B:
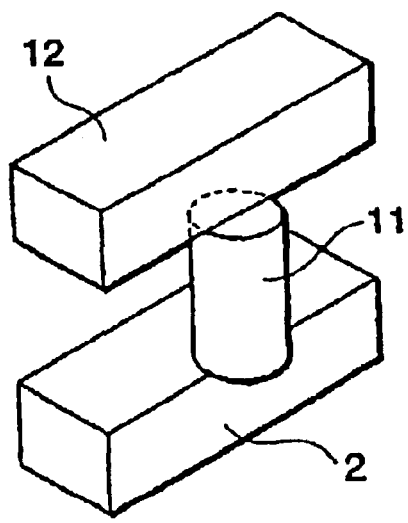

FIG. 7 shows an essential part of a multilayered wiring structure. The multilayered wiring structure may a border wiring structure shown in FIG. 7A or a borderless wiring structure shown in FIG. 7B. The border wiring structure is a structure wherein the end of a tungsten plug 11 falls within the width of a lower wiring 2 as shown in FIG. 7A. The borderless wiring structure is a structure wherein the end of a tungsten plug 11 extends off the width of a lower wiring 2, as shown in FIG. 7B.

Referring back to FIG. 6 will make a description here. Even if the high integration progresses and the wiring width W becomes narrow, no problem occurs if the lithography technology also progresses simultaneously and the alignment displacement D can be also reduced. A problem arises where the lithography technology becomes slow in progress. This is because the border wiring structure described in FIG. 7A cannot be maintained and the borderless wiring structure described in FIG. 7B is adopted. In the borderless wiring structure, an open end of a hole 8 defined to form the tungsten plug 11 extends out to an area for forming an MSQ film 5. Accordingly, a problem arises in that an MSQ material deteriorates or changes in quality and corrodes due to a $WF_6$ gas.

In the present invention, such a problem was solved by adjusting the thickness of the first silicon oxide film 4 corresponding to a liner film. When a liner thickness T is set so as to meet the following expression:

$$W/2 + T \geq X + D,$$

the border wiring structure can be maintained. Namely, the liner thickness T may be adjusted so to satisfy the following expression:

$$T \geq X + D - W/2.$$

Figure 5E:
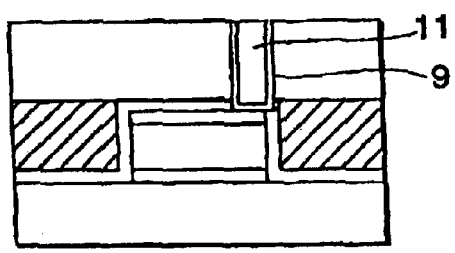
Figure 5C:
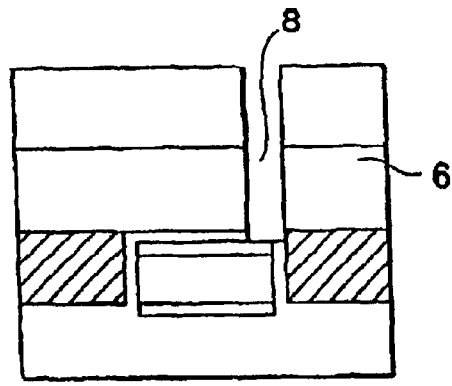

Next, as shown in FIG. 5C, the second silicon oxide film 6 is dry-etched to define a hole 8. The result of its formation corresponds to a process step shown in the drawing. This etching is effected on the normal silicon oxide film and executed by means of plasma etching in a $C_4F_8/O_2/Ar$ gas system.

Next, as shown in FIG. 5D, the resist 7 is removed by ashing, and the interior of the hole 8 defined in the second silicon oxide film 6 and its flat portion are cleaned, after which a tungsten layer 10 is formed by CVD.

Further, as shown in FIG. 5E, the tungsten layer 10 is etched to form a tungsten plug 11.

Figure 5F:
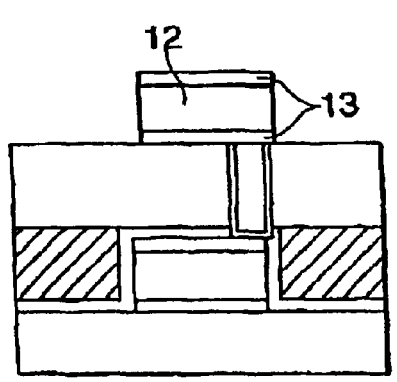

Subsequently, an upper wiring 12 is formed as shown in FIG. 5F.

According to the above-described process, a two-layer wiring structure is formed.

By repeating the above-described process, three-layer or four-layer wiring structure is formed.

According to the second embodiment as described above, the liner thickness is adjusted according to the wiring width, the contact diameter and the alignment displacement. It is therefore possible to prevent the low specific inductive capacity material from deteriorating due to a $WF_6$ gas to thereby increase a dielectric constant and eroding to thereby cause a defective or chipped portion upon the process step of forming the tungsten plug. It is also possible to prevent the occurrence of a large-scale cavity and development of a short circuit between wirings due to the entrance of tungsten therein.

While the first and second embodiments respectively have described as above the case in which the MSQ film 5 has been used as the low specific inductive capacity material, and the aluminum alloy has been used as the wiring material, the present invention is not limited to these. An HSQ film, an SiOC film, an SiO—CH film or the like containing Si—O as a major skeleton may be used as the low specific inductive capacity material. Alternatively, an organic polymer film may be adopted. On the other hand, a copper damascene wiring may be formed using copper, as the wiring material.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a multilayered wiring structured semiconductor device, comprising:

forming a wiring on a semiconductor substrate;

forming a first silicon oxide film on the semiconductor substrate and on the wiring;

forming an interlayer insulating film composed of a material bearing a low specific inductive capacity on the first silicon oxide film over the semiconductor substrate, the interlayer insulating film having a thickness so as not to extend beyond a height of the first silicon oxide film formed on the wiring;

forming a second silicon oxide film on the interlayer insulating film and on the first silicon oxide film formed on the wiring;

planarizing the second silicon oxide film;

patterning a resist on the second silicon oxide film by lithography;

etching the second silicon oxide film and the first silicon oxide film with the resist as a mask, to form a hole that exposes the wiring;

removing the resist by ashing after completion of said etching; and cleaning the semiconductor substrate after said removing the resist, wherein a thickness of the first silicon oxide film is selected dependent on a width of the wiring, a diameter of the hole, and an alignment displacement of said etching.

2. The method according to claim 1, wherein the interlayer insulating film is MSQ.

3. The method according to claim 1, wherein the interlayer insulating film is formed by a spin coat method.

4. The method according to claim 1, wherein said etching is a plasma etching, and wherein the hole does not contact the interlayer insulating film.

5. The method according to claim 1, wherein the thickness of the first silicon oxide film is selected to satisfy:

$$T \geq X+D-W/2,$$

wherein T is the thickness of the first silicon oxide film, X is the diameter of the hole, D is the alignment displacement and W is the width of the wiring.

6. A method of manufacturing a multilayered wiring structured semiconductor device, comprising:
   forming a wiring on a semiconductor substrate;
   forming a liner film on the semiconductor substrate and on the wiring;
   forming an interlayer insulating film composed of a material bearing a low specific inductive capacity on the liner film over the semiconductor substrate, the interlayer insulating film having a thickness that does not extend beyond a height of the wiring formed on the semiconductor substrate;
   forming a silicon oxide film on the interlayer insulating film and on the liner film formed over the wiring;
   planarizing the silicon oxide film;
   patterning a resist on the silicon oxide film by lithography;
   etching the silicon oxide film and the liner film using the resist as a mask to form a hole that exposes the wiring, without etching the interlayer insulating film;
   removing the resist by ashing after completion of said etching; and
   cleaning the semiconductor substrate after said removing the resist,
   wherein a thickness of the liner film is selected dependent on a width of the wiring, a diameter of the hole, and an alignment displacement of said etching.

7. The method according to claim 6, wherein the interlayer insulating film is MSQ.

8. The method according to claim 6, wherein the interlayer insulating film is formed by a spin coat method.

9. The method according to claim 6, wherein said etching is a plasma etching, and wherein the hole does not contact the interlayer insulating film.

10. The method according to claim 6, wherein the thickness of the liner film is selected to satisfy:

$$T \geq X+D-W/2,$$

wherein T is the thickness of the liner film, X is the diameter of the hole, D is the alignment displacement and W is the width of the wiring.

11. The method according to claim 6, wherein the liner film is a silicon oxide film.

12. A method of manufacturing a multilayered wiring structured semiconductor device, comprising:
   forming a wiring on a semiconductor substrate;
   forming a first silicon oxide film on the semiconductor substrate and on the wiring;
   forming an interlayer insulating film having a low specific inductive capacity on the first silicon oxide film over the semiconductor substrate, the interlayer insulating film having a thickness so as not to extend beyond a height of the first silicon oxide film formed on the wiring;
   forming a second silicon oxide film on the interlayer insulating film and on the first silicon oxide film formed on the wiring; and
   etching the second silicon oxide film and the first silicon oxide film using a mask to form a hole that exposes the wiring, wherein the interlayer insulating film is not etched,
   wherein a thickness of the first silicon oxide film is selected dependent on a width of the wiring, a diameter of the hole, and an alignment displacement of said etching.

13. The method according to claim 12, wherein the interlayer insulating film is MSQ.

14. The method according to claim 12, wherein the interlayer insulating film is HSQ.

15. The method according to claim 12, wherein the interlayer insulating film is formed by a spin coat method.

16. The method according to claim 12, wherein the thickness of the first silicon oxide film is selected to satisfy:

$$T \geq X+D-W/2,$$

wherein T is the thickness of the first silicon oxide film, X is the diameter of the hole, D is the alignment displacement and W is the width of the wiring.

* * * * *